(12) United States Patent
Takabayashi et al.

(10) Patent No.: US 10,312,663 B2
(45) Date of Patent: Jun. 4, 2019

(54) TUNABLE LASER DEVICE

(71) Applicant: FUJITSU LIMITED, Kawasaki-shi, Kanagawa (JP)

(72) Inventors: Kazumasa Takabayashi, Atsugi (JP); Suguru Akiyama, Tsukuba (JP); Tsuyoshi Yamamoto, Zama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/886,901

(22) Filed: Feb. 2, 2018

(65) Prior Publication Data

US 2018/0226767 A1     Aug. 9, 2018

(30) Foreign Application Priority Data

Feb. 6, 2017    (JP) ................. 2017-019692

(51) Int. Cl.
| | |
|---|---|
| *H01S 5/00* | (2006.01) |
| *H01S 5/14* | (2006.01) |
| *G02F 1/01* | (2006.01) |
| *H01S 5/10* | (2006.01) |
| *H01S 5/026* | (2006.01) |
| *H01S 5/40* | (2006.01) |
| *H01S 5/0687* | (2006.01) |

(52) U.S. Cl.
CPC .............. *H01S 5/142* (2013.01); *G02F 1/011* (2013.01); *H01S 5/026* (2013.01); *H01S 5/0687* (2013.01); *H01S 5/1007* (2013.01); *H01S 5/1025* (2013.01); *H01S 5/1032* (2013.01); *H01S 5/1092* (2013.01); *H01S 5/14* (2013.01); *H01S 5/141* (2013.01); *H01S 5/146* (2013.01); *H01S 5/4068* (2013.01); *H01S 5/0262* (2013.01); *H01S 5/0264* (2013.01)

(58) Field of Classification Search
CPC ...... H01S 5/142; H01S 5/0687; H01S 5/1032; H01S 5/1025; H01S 5/0262; H01S 5/0264; H01S 5/026; H01S 5/1007; H01S 5/4068; H01S 5/1092; H01S 5/146; H01S 5/141

See application file for complete search history.

(56) References Cited

U.S. PATENT DOCUMENTS 8,451,872 B2 *   5/2013   Arimoto ............... G02F 1/3133
                                             372/102
9,774,164 B2 *   9/2017   Chaouch ............... G02B 6/125
(Continued)

FOREIGN PATENT DOCUMENTS

| JP | 2013-15728 | 1/2013 |
|---|---|---|
| JP | 2015-60944 | 3/2015 |
| JP | 2015-68854 | 4/2015 |

*Primary Examiner* — Kinam Park
(74) *Attorney, Agent, or Firm* — Fujitsu Patent Center

(57) ABSTRACT

A apparatus includes a tunable laser configured to include a tunable filter and a mirror; a first optical splitter provided between the tunable filter and the mirror, the first optical splitter including a first port and a second port on a tunable filter side and a third port and a fourth port on a mirror side, in which the tunable filter is coupled to the first port and the mirror is coupled to the third port, respectively; a first optical waveguide coupled to the second port; a second optical waveguide coupled to the fourth port; and an optical coupler with which the first optical waveguide and the second optical waveguide are combined.

12 Claims, 10 Drawing Sheets

(56) References Cited

U.S. PATENT DOCUMENTS

| | | | |
|---|---|---|---|
| 2005/0075547 A1* | 4/2005 | Wang | A61B 5/0066 |
| | | | 600/316 |
| 2015/0085292 A1* | 3/2015 | Uesaka | G01J 9/0246 |
| | | | 356/477 |
| 2015/0153512 A1* | 6/2015 | Grote | G02F 1/0147 |
| | | | 385/42 |
| 2017/0353001 A1* | 12/2017 | Takabayashi | H01S 5/06255 |

* cited by examiner

TUNABLE LASER DEVICE

CROSS-REFERENCE TO RELATED APPLICATION

This application is based upon and claims the benefit of priority of the prior Japanese Patent Application No. 2017-19692, filed on Feb. 6, 2017, the entire contents of which are incorporated herein by reference.

FIELD

The embodiments discussed herein are related to a tunable laser device and an optical transceiver.

BACKGROUND

A wavelength division multiplexing (WDM) communication system is an optical communication system using a wavelength multiplexing technology. The WDM communication system is a technology capable of drastically increasing the transmission capacity by bundling signal light of an equal-grid wavelength defined by standardization and transmitting the signal light in one optical fiber. A tunable laser is mainly used as a light source of the WDM communication system. In the tunable laser used in the WDM communication system, it is desirable to precisely control an oscillation wavelength so as to match the grid wavelength, and generally, a wavelength locker is used.

A wavelength locker of the related art includes, for example, a first beam splitter, a second beam splitter, an etalon, a first photodetector, and a second photodetector. From the output light of the tunable laser, a part of the light branched by the first beam splitter is further split into two light beams by the second beam splitter. One of the light beams passes through a periodic filter such as an etalon, and the transmitted light intensity thereof is monitored by the first photodetector. The light intensity of the other light beam is monitored by the second photodetector as it is. The ratio of the monitored values of the first photodetector and the second photodetector (corresponding to the transmittance of the etalon) is fed back so that the ratio matches the value of the transmittance of the etalon at a desired wavelength, and the wavelength is controlled.

Since a wavelength locker is constituted of a large number of parts as described above, the size thereof is large and is an obstacle to miniaturization of a tunable laser device which incorporates a wavelength locker in a single package together with a tunable laser. On the other hand, for example, Japanese Laid-open Patent Publication No. 2015-68854 discloses a technology of miniaturizing the size of the wavelength locker by concentrating the beam splitters and a delay interference waveguide serving as an alternative to the etalon as one optical waveguide device. The delay interference waveguide is constituted by splitting light into two and including a first optical waveguide and a second optical waveguide having different lengths. By propagating the branched light to the first optical waveguide and the second optical waveguide, respectively, and then coupling the propagated light again, the delay interference waveguide serves as a filter in which the intensity of the output light periodically varies with respect to the wavelength, corresponding to the optical waveguide length difference between the first optical waveguide and the second optical waveguide. The wavelength cycle of the delay interference waveguide is inversely proportional to the optical waveguide length difference between the first optical waveguide and the second optical waveguide. By adopting such a configuration, it is possible to remarkably reduce the size of the wavelength locker as compared with the case using a plurality of parts in the related art.

Japanese Laid-open Patent Publication No. 2015-60944, and Japanese Laid-open Patent Publication No. 2013-15728 are examples of the related art.

In a WDM communication system, a grid interval is mainly 50 GHz at present, and it is thought that the interval will shift to a narrower interval such as 6.25 GHz in the future. In the wavelength locker of 50 GHz for the grid interval, a periodic filter frequency of 50 GHz is appropriate, but in order to realize such a filter in a delay interference waveguide, it is desirable to set an optical path length difference between the two optical waveguides approximately 6 mm. Depending on the material of the optical waveguide, a desirable optical waveguide length difference becomes very long as 1.5 mm to 4 mm. Further, in the future, considering shifting to a narrower grid interval, it is expected that a desirable optical waveguide length will be further increased. Therefore, in a case where a delay interference waveguide is used as a periodic filter for a wavelength locker, there is a limit to miniaturization of the size thereof, which is an obstacle to miniaturization of a tunable laser device including a wavelength locker.

SUMMARY

According to an aspect of the embodiments, a tunable laser device includes a tunable laser configured to include a tunable filter and a mirror; a first optical splitter provided between the tunable filter and the mirror, the first optical splitter including a first port and a second port on a tunable filter side and a third port and a fourth port on a mirror side, in which the tunable filter is coupled to the first port and the mirror is coupled to the third port, respectively; a first optical waveguide coupled to the second port; a second optical waveguide coupled to the fourth port; and an optical coupler with which the first optical waveguide and the second optical waveguide are combined.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments of a tunable laser device will be described in detail with reference to drawings.

First Embodiment

Figure 1:
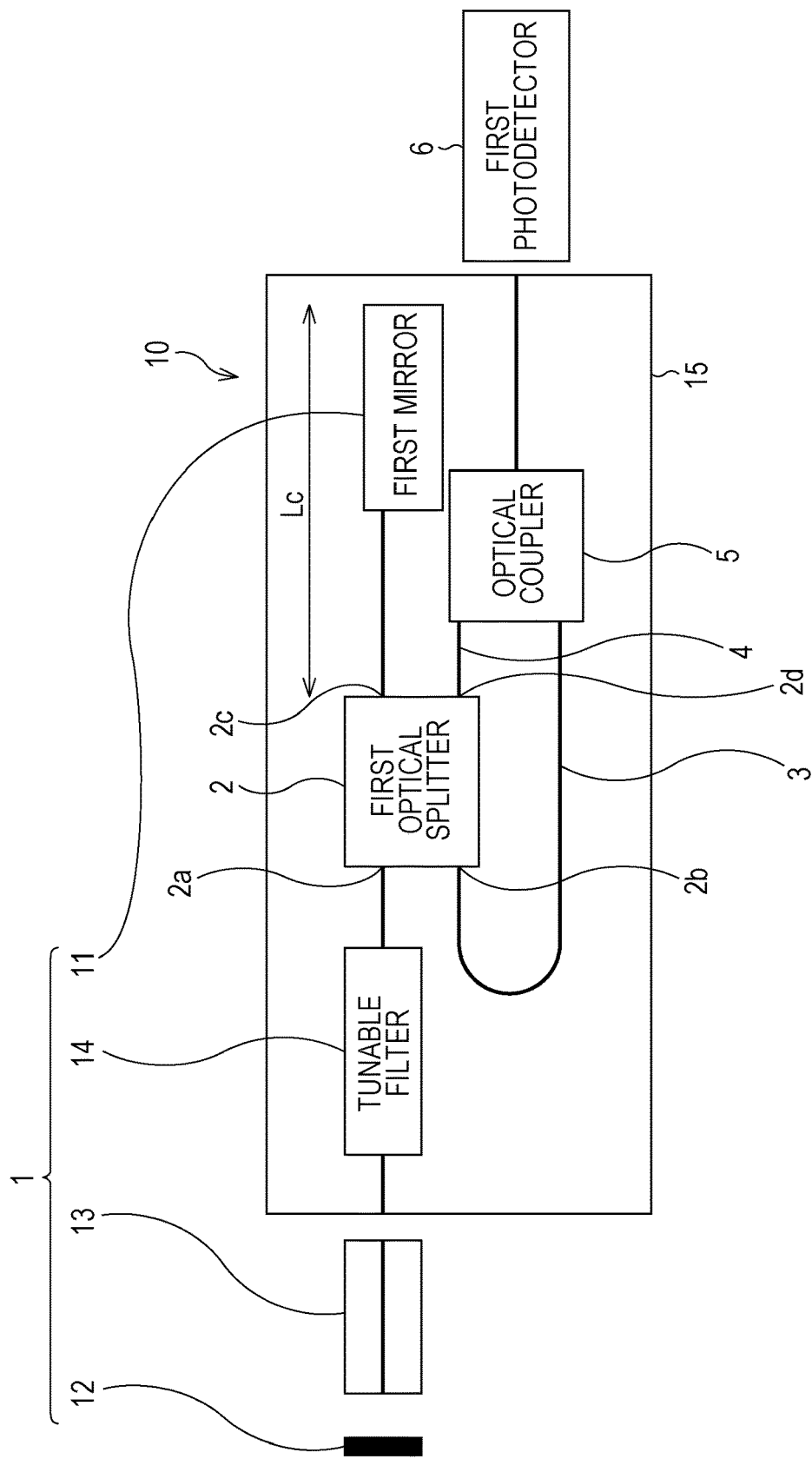
FIG. 1 is a schematic diagram illustrating a basic configuration of a tunable laser device according to a first embodiment.

FIG. 1 is a schematic diagram illustrating a basic configuration of a tunable laser device according to a first embodiment. The tunable laser device includes a tunable laser 1, a first optical splitter 2, a first optical waveguide 3, a second optical waveguide 4, an optical coupler 5, and a first photodetector 6.

The tunable laser 1 includes a first mirror 11 and a second mirror 12, and a semiconductor optical amplifier (SOA) 13 and a tunable filter 14 are disposed between the first mirror 11 and the second mirror 12. A laser resonator is constituted between the first mirror 11 and the second mirror 12. The first optical splitter 2, the first optical waveguide 3, the second optical waveguide 4, the optical coupler 5, the first photodetector 6, and the first mirror 11 (common with the tunable laser 1) function as wavelength lockers having a periodic light transmission characteristic. Among the wavelength lockers, a delay interference waveguide is constituted by an optical waveguide portion between the first optical splitter 2 and the first mirror 11, and the first optical waveguide 3 and the second optical waveguide 4.

The first mirror 11, the tunable filter 14 and the first optical splitter 2 which are constituent members of the tunable laser 1, together with the first optical waveguide 3, the second optical waveguide 4 and the optical coupler 5, are formed on a semiconductor substrate 15 as an optical waveguide to become an optical waveguide device structure 10.

The first optical splitter 2 is disposed between the tunable filter 14 and the first mirror 11 and includes a first port 2a and a second port 2b on the tunable filter 14 side, and a third port 2c and a fourth port 2d on the first mirror 11 side. The tunable filter is coupled to the first port 2a, the first optical waveguide 3 is coupled to the second port 2b, the first mirror 11 is coupled to the third port 2c, and the second optical waveguide 4 is coupled to the fourth port 2d. In the optical coupler 5, the first optical waveguide 3 and the second optical waveguide 4 are coupled to one end side and the first photodetector 6 is coupled to the other end side, respectively, and the optical coupler 5 optically couples the light beams that have respectively passed through the first optical waveguide 3 and the second optical waveguide 4.

In the laser resonator of this tunable laser device, the laser light having the wavelength selected by the tunable filter 14 makes a round trip between the first mirror 11 and the second mirror 12. The light propagating in the laser resonator from the SOA 13 side is branched in two directions in the first optical splitter 2, one light beam propagates into the laser resonator via the third port 2c, and the other light beam propagates to the second optical waveguide 4 via the fourth port 2d. The light propagating from the side opposite to the SOA 13, that is, from the side of the first mirror 11 is branched into two directions by the first optical splitter 2, and one light beam propagates into the laser resonator as it is via the first port 2a, and the other light beam propagates to the first optical waveguide 3 via the second port 2b. The light propagating through the first optical waveguide 3 and the second optical waveguide 4 is optically coupled by the optical coupler 5. The intensity of the light output from the optical coupler 5 varies with a period corresponding to a delay amount in the two types of light with respect to the wavelength. Therefore, the delay interference waveguide including the optical waveguide portion between the first optical splitter 2 and the first mirror 11 and the first optical waveguide 3, and the second optical waveguide 4 is used as an optical waveguide having the periodic transmission characteristic.

Figure 2:
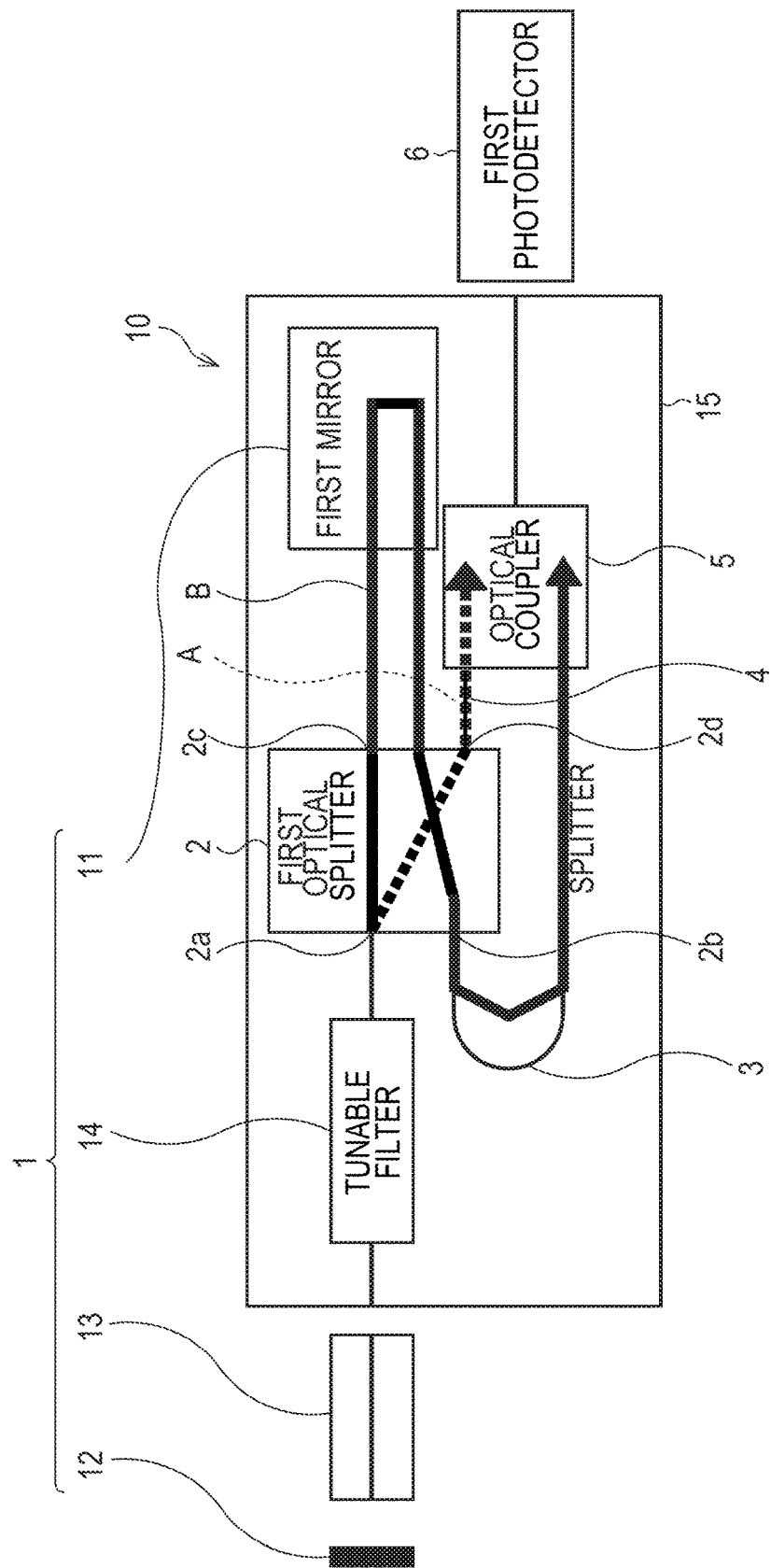
FIG. 2 is a schematic diagram for explaining a function and an effect of the tunable laser device according to the first embodiment.

FIG. 2 is a schematic diagram for explaining a function and an effect of the tunable laser device according to the first embodiment. It is considered that the first port 2a of the first optical splitter 2 is as a starting point of light. As indicated by an arrow A indicated by a broken line, the light propagating to the second optical waveguide 4 directly enters the fourth port 2d from the first port 2a. On the other hand, as indicated by an arrow B indicated by a solid line, the light propagating to the first optical waveguide 3 propagates from the first port 2a to the third port 2c and makes a round trip between the third port 2c and the first mirror 11, and enters the first optical waveguide 3 from the third port 2c via the second port 2b. The light propagating to the first optical waveguide 3 is delayed by a distance of a round trip distance between the third port 2c and the first mirror 11 before entering the first optical splitter 2 with respect to the light propagating to the second optical waveguide 4. Therefore, a delay amount ΔL of the light propagating through the first optical waveguide 3 with respect to the light propagating through the second optical waveguide 4 has the following relationship in a case where the optical waveguide lengths of the first optical waveguide 3 and the second optical waveguide 4 are $L_1$ and $L_2$ and the distance between the first optical splitter 2 and the first mirror 11 is $L_C$.

$$\Delta L = (L_1 + 2L_C) - L_2 \quad (1)$$

$L_1$, $L_2$, and $L_C$ are adjusted so that the value of ΔL becomes a delay amount corresponding to the light transmission characteristic of a desired cycle.

On the other hand, for example, in Japanese Laid-open Patent Publication No. 2015-68854, if the optical waveguide lengths of the first optical waveguide and the second optical waveguide constituting the delay interference waveguide in the wavelength locker are $L_1$ and $L_2$ ($L_1 \geq L_2$), a light delay amount $\Delta L_0$ has the following relationship.

$$\Delta L_0 = L_1 - L_2 \quad (2)$$

From equations (1) and (2), in the present embodiment, the length of the first optical waveguide desired to obtain the same delay amount as that of the delay interference waveguide in Japanese Laid-open Patent Publication No. 2015-68854 may be shortened by $2L_C$ as compared with the case of Japanese Laid-open Patent Publication No. 2015-68854. In this manner, it is possible to miniaturize the size of the wavelength locker and further miniaturize the overall size of the tunable laser device including the wavelength locker.

Figure 3:
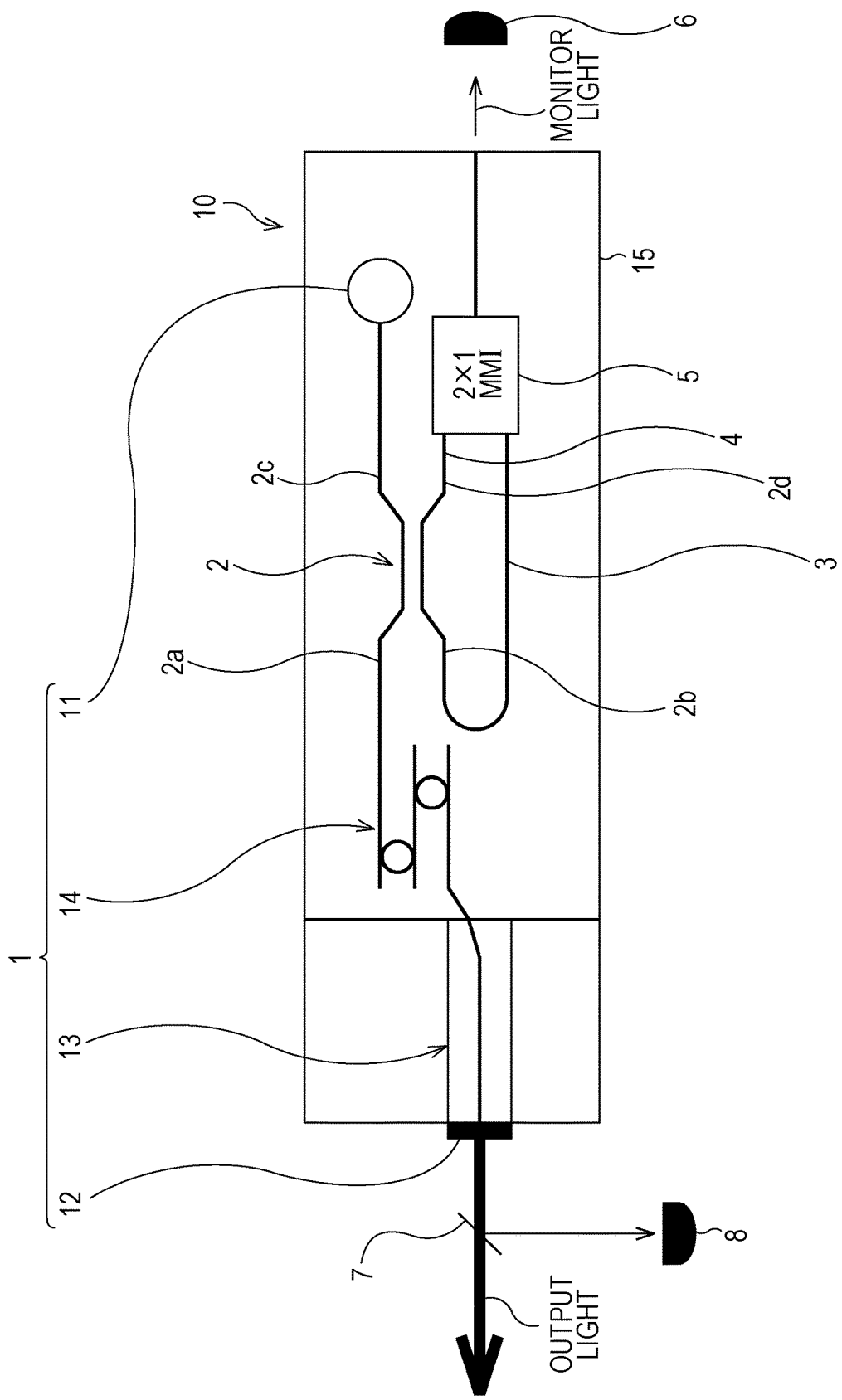
FIG. 3 is a schematic diagram illustrating a configuration example of the tunable laser device according to the first embodiment.

A more specific configuration example of the tunable laser device according to the present embodiment will be described below. FIG. 3 is a schematic diagram illustrating a configuration example of the tunable laser device according to the first embodiment.

This tunable laser device includes the constituent members of the tunable laser device according to the present embodiment illustrated in FIG. 1 and includes a beam splitter 7 and a second photodetector 8 which is a photodiode in the vicinity of the second mirror 12. In the optical waveguide device structure 10, the first mirror 11, the tunable filter 14, the first optical splitter 2, and the optical coupler 5 are constituted of a silicon waveguide together with the first optical waveguide 3 and the second optical waveguide 4 on the semiconductor substrate 15 which is a silicon substrate.

The first optical splitter 2 is a 2×2 directional coupler. The optical coupler 5 is a 2×1 multi-mode interference waveguide (MMI) optical coupler. The first photodetector 6 is a photodiode. The first mirror 11 is a loop mirror. The tunable filter 14 is a vernier-type filter having a double-ring resonator, and heater electrodes are provided on the double ring resonator. In this filter, by heating a ring resonator (for example, one-ring resonator) with the heater electrodes, a refractive index of the ring resonator varies, and a wavelength at which the periodic resonance wavelengths overlap in the two ring resonators varies. Thus, an arbitrary wavelength may be selected.

In the optical waveguide device structure 10, on the side opposite to the first mirror 11 with respect to the first optical splitter 2, the tunable filter 14 and the SOA 13 serving as a gain medium are optically coupled. In the SOA 13, for example, the structure of the active layer is adjusted so as to have a gain around a wavelength of 1.55 μm. On the end face of the SOA 13 coupled with the tunable filter 14, the optical waveguide is inclined with respect to the end face, and the end face is subjected to nonreflective coating. On the opposite end face of the SOA 13, the optical waveguide is perpendicular to the end face, and the end face is a cleavage face. The end face functions as the second mirror 12, and a laser resonator is formed between the loop mirror serving as the first mirror 11 and the end face of the SOA 13 which is the second mirror 12.

The output light of the tunable laser 1 is extracted from the second mirror 12 which is the end face of the SOA 13. A part of the output light is branched by the beam splitter 7, and the output light intensity is monitored by the second photodetector 8. In the first optical splitter 2 which is a directional coupler, for example, the optical waveguide is coupled so that the first port 2a and the third port 2c, and the second port 2b and the fourth port 2d become through ports. The gap and the coupling length of the optical waveguide of the coupling portion are appropriately adjusted so that, for example, 20% of light is coupled to a cross port side, that is the fourth port 2d from the first port 2a or the second port 2b from the third port 2c.

The tunable filter 14 is coupled to the first port 2a and the first mirror 11 is coupled to the third port 2c, and 80% of the light propagates into the laser resonator as it is. In the first optical splitter 2, the second optical waveguide 4 is coupled to the cross port on the side of the first mirror 11, that is, the fourth port 2d. In the second optical waveguide 4, the light propagated from the SOA 13 and the tunable filter 14 side is branched by the first optical splitter 2 and propagated, and the ratio is 20%. The first optical waveguide 3 is coupled to the cross port on the tunable filter 14 side of the first optical splitter 2, that is, the second port 2b. In the first optical waveguide 3, the light propagated from the first mirror 11 side is branched by the first optical splitter 2 and propagated, and the ratio is 20%.

The first optical waveguide 3 and the second optical waveguide 4 are optically coupled by the optical coupler 5 on the side opposite to the first optical splitter 2, and the coupled light is output from the end face of the optical waveguide device structure 10. The intensity of the output light is monitored by the first photodetector 6. Based on the ratio of the monitored values of the first photodetector 6 and the second photodetector 8 (corresponding to the transmittance of the delay interference waveguide), feedback is applied to a power supply of the heater electrodes in the double-ring resonator of the tunable filter 14 to control the wavelength of the laser light.

The optical waveguide length $L_1$ of the first optical waveguide 3, the optical waveguide length $L_2$ of the second optical waveguide 4, and the distance $L_C$ between the first optical splitter 2 and the first mirror 11 differ depending on a target cycle of the tunable filter 14 used as a wavelength locker. For example, in order to obtain a cycle of 50 GHz frequency (0.4 nm in wavelength), a total of, for example, 1.5 mm is desired as the delay amount ΔL. Therefore, $\Delta L = (L_1 + 2L_C) - L_2 = 1.5$ mm may be obtained from the above Equation (1).

For example, assuming that $L_C$ is about 0.75 mm, it is sufficient to dispose all the delay portions of the delay interference waveguide in the laser resonator so that $L_1$ has the same length as $L_2$, and it is not necessary to additionally dispose an optical waveguide in the delay interference waveguide of the wavelength locker. That is, in Japanese Laid-open Patent Publication No. 2015-68854, it is necessary to set the first optical waveguide longer by about 1.5 mm than the second optical waveguide, but this is not necessary desired in the present embodiment. As a result, it is possible to reduce the size of the wavelength locker and, further, to reduce the overall size of the tunable laser device including the wavelength locker.

Furthermore, in a case where the frequency corresponding to the cycle of the tunable filter 14 is set to be small, for example, about 25 GHz, the delay amount is preferably about 3 mm in total. In the present embodiment, for example, if $L_C$=about 0.75 mm, $L_1$ may be set longer than $L_2$ by about 1.5 mm. In this case, the length of the delay interference waveguide may be halved and the size of the wavelength locker portion may be miniaturized as compared with Japanese Laid-open Patent Publication No. 2015-68854.

As described above, according to the tunable laser device of the present embodiment, at least a part of the length necessary for the delay interference waveguide of the wavelength locker may be compensated by the length of the optical waveguide in the laser resonator. As a result, it is possible to miniaturize the size of the delay interference waveguide of the wavelength locker and further miniaturize the size of the entire tunable laser device including the wavelength locker.

In this embodiment, since the delay portion of the delay interference waveguide is partially compensated in the laser resonator, it is preferable that the tunable laser 1 has a long resonator length. For example, in a laser light source used for a phase modulation method, it is desired that a spectral line width is narrow, and it is effective to increase the resonator length for the narrow line width. Therefore, in general, a laser with a large resonator length is used. Therefore, by applying the technology of the present embodiment to the tunable laser device of the narrow line width, the delay portion may be supplemented longer in the laser resonator, thus the tunable laser device functions more effectively.

Second Embodiment

Figure 4:
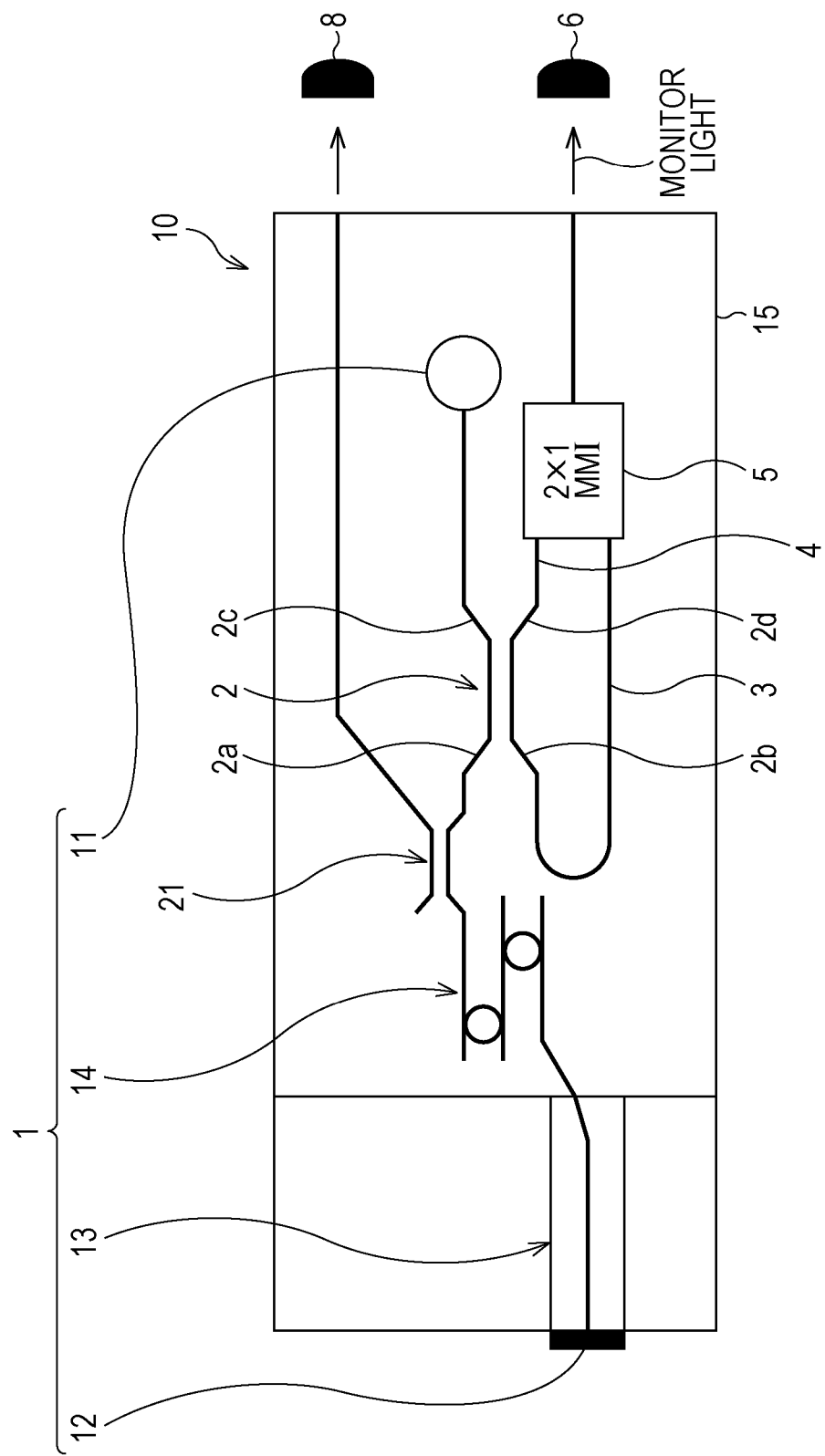
FIG. 4 is a schematic diagram illustrating a configuration example of a tunable laser device according to a second embodiment.

A second embodiment will be described below. In the present embodiment, a tunable laser device is disclosed similarly to the first embodiment, but differs from the first embodiment in that the configuration of the wavelength locker is different. FIG. 4 is a schematic diagram illustrating a configuration example of the tunable laser device according to the second embodiment. In FIG. 4, the same components as those illustrated in FIG. 3 of the first embodiment are denoted by the same reference numerals, and a detailed description thereof will be omitted.

In this tunable laser device, a second optical splitter 21 which is another directional coupler is inserted between the tunable filter 14 having a double-ring resonator and the first optical splitter 2 which is a directional coupler. A part of the light propagating into the laser resonator is separately branched by the second optical splitter 21. The splitting ratio of light by the second optical splitter 21 is, for example, 10:1 between the lower side and the upper side in FIG. 4. The tunable filter 14 and a first optical splitter 2 are coupled to the lower side of the second optical splitter 21. On the upper side of the second optical splitter 21, an optical waveguide is provided so that the light that has passed through is emitted from the end face of the optical waveguide device structure 10 as it is. The second photodetector 8, which is a photodiode, is arranged at a position for monitoring the outgoing light.

The second photodetector 8 may monitor the light intensity entering the first optical splitter 2. By standardizing the ratio between a monitor value of the first photodetector 6 which monitors the light passing through the delay interference waveguide and a monitor value of the second photodetector 8, it is possible to monitor a value corresponding to the transmittance of delay interference waveguide. By controlling the wavelength of the output light of the tunable laser 1 so that this monitor value coincides with the value corresponding to the transmittance of the desired wavelength, it is possible to perform precise wavelength control.

According to the tunable laser device according to the present embodiment, a beam splitter for splitting the light to the second photodetector 8 becomes optional as compared with the first embodiment. Therefore, the size of the wavelength locker may be further miniaturized, and the size of the entire tunable laser device including the wavelength locker may be remarkably miniaturized.

In the present embodiment, the second optical splitter 21 is arranged between the tunable filter 14 and the first optical splitter 2, but instead of this configuration, it is also possible to adopt a configuration in which the second optical splitter 21 is arranged between the first optical splitter 2 and the first mirror 11, for example.

Modification Example

Figure 5:
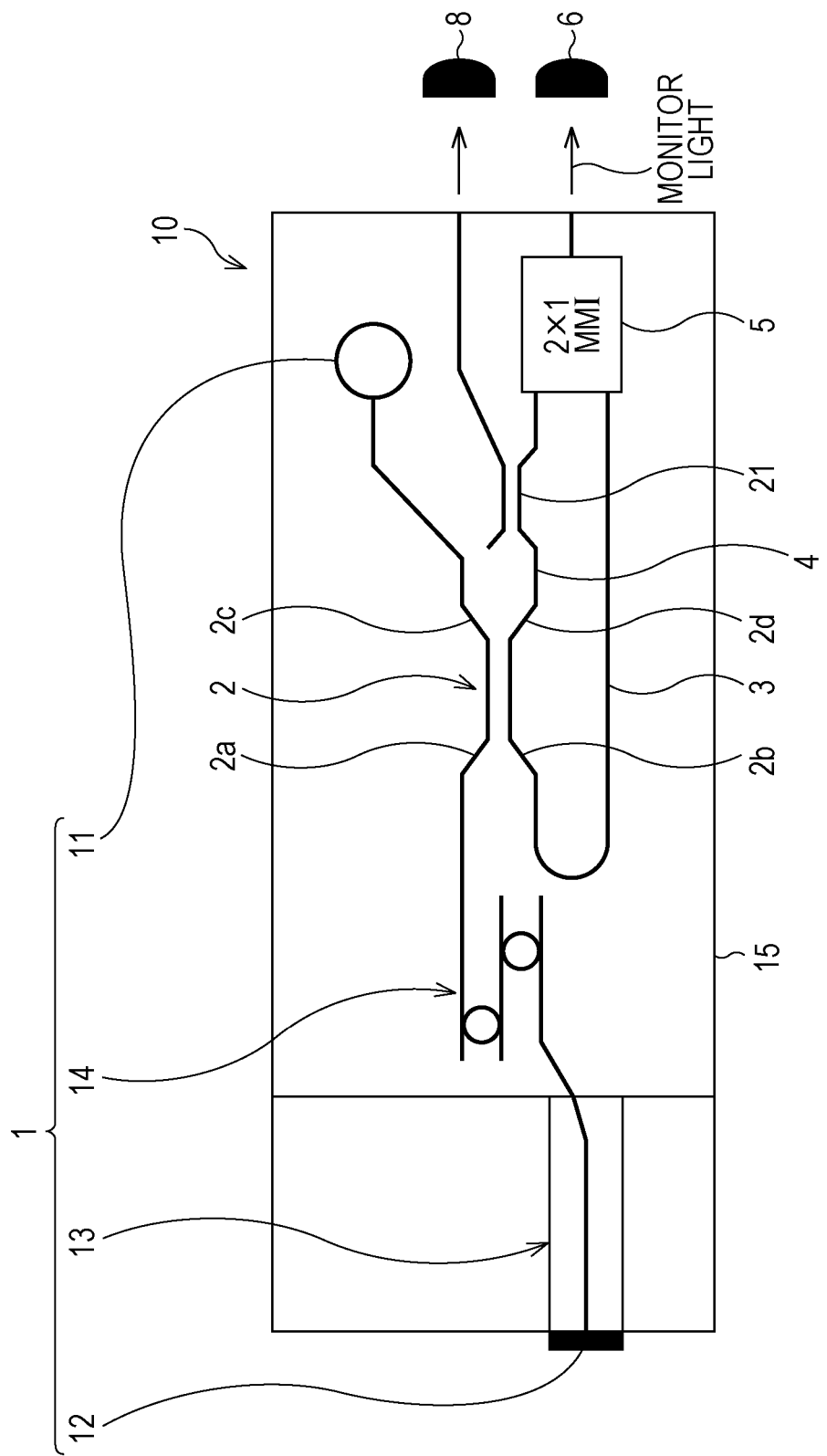
FIG. 5 is a schematic diagram illustrating a configuration example of a tunable laser device according to a modification example of the second embodiment.

Here, a modification example of the second embodiment will be described. FIG. 5 is a schematic diagram illustrating a configuration example of a tunable laser device according to a modification example of the second embodiment. In FIG. 5, the same components as those illustrated in FIG. 4 are denoted by the same reference numerals, and a detailed description thereof will be omitted. In this tunable laser device, the second optical splitter 21 is inserted into the second optical waveguide 4 instead of the configuration in which the second optical splitter 21 is arranged between the tunable filter 14 and the first optical splitter 2.

The light propagating through the second optical waveguide 4 before being optically coupled by the first optical coupler 5 is the light before the wavelength dependency arises due to the interference with the light propagating through the first optical waveguide 3. Therefore, by the second optical splitter 21, the light propagating through the second optical waveguide 4 before being optically coupled by the first optical coupler 5 may be monitored by the second photodetector 8 as it is as a laser light intensity. Therefore, also in this configuration, by standardizing the monitor value of the first photodetector 6 with the monitor value of the second photodetector 8 and obtaining a value corresponding to the transmittance of the delay interference waveguide which is a periodic filter in the wavelength locker, it is possible to control the wavelength of the laser light based on this value.

The light originally directed toward the first optical waveguide 3 receives an extra loss of the reciprocating portion between the first optical splitter 2 and the first mirror 11. Therefore, the light propagating through the second optical waveguide 4 has a small loss with respect to the light propagating through the first optical waveguide 3. In the present embodiment, by inserting the second optical splitter 21 into the second optical waveguide 4, it is possible to improve the balance of the intensities of the light propagating through the first optical waveguide 3 and the second optical waveguide 4 and to improve the extinction ratio of the periodic filter characteristic.

Third Embodiment

Figure 6:
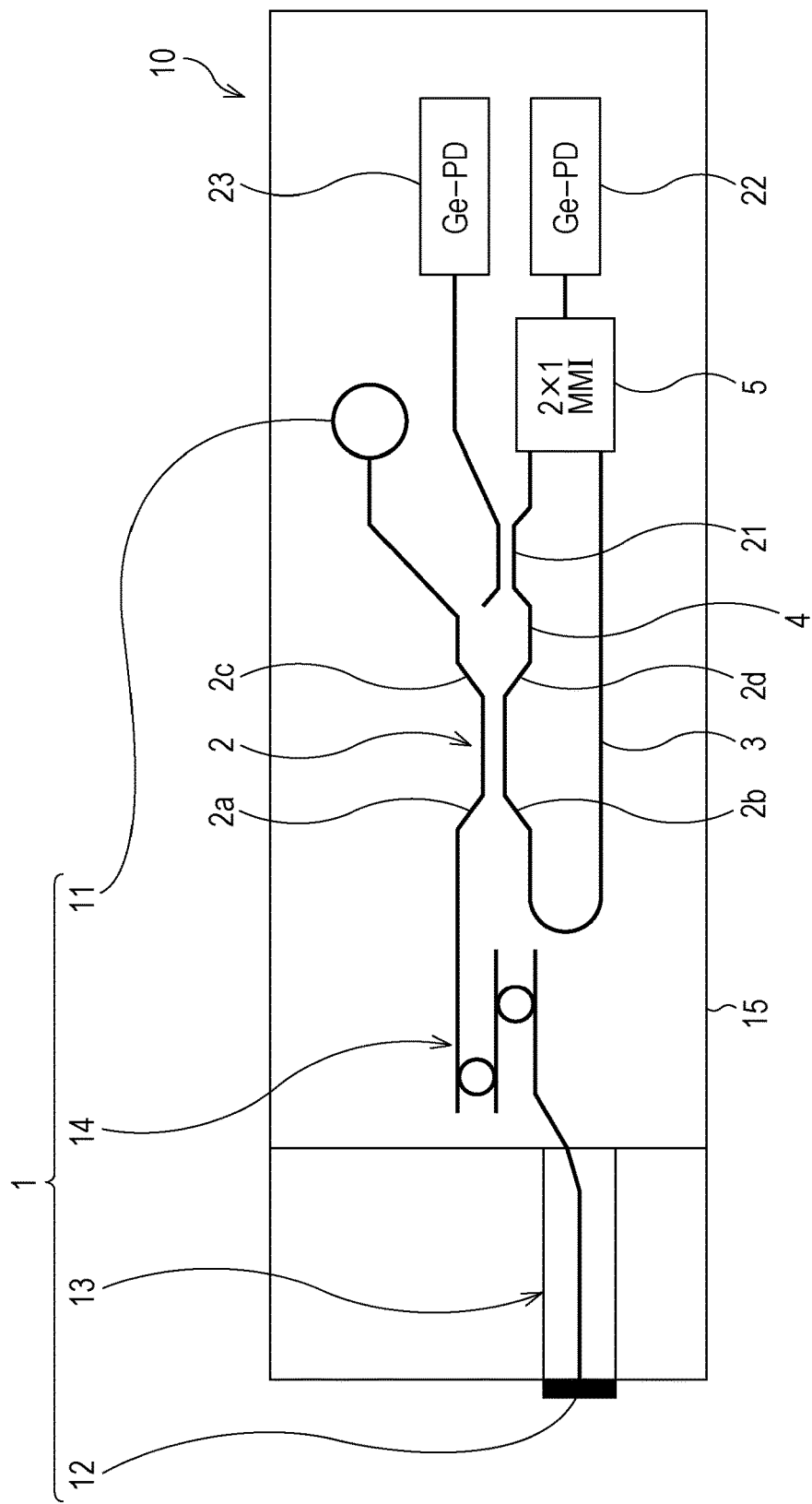
FIG. 6 is a schematic diagram illustrating a configuration example of a tunable laser device according to a third embodiment.

A third embodiment will be described below. In the present embodiment, a tunable laser device is disclosed similarly to the second embodiment, but differs from the second embodiment in that the configuration of the wavelength locker is different. FIG. 6 is a schematic diagram illustrating a configuration example of the tunable laser device according to the third embodiment. In FIG. 6, the same components as those illustrated in FIG. 5 of the modification example of the second embodiment are denoted by the same reference numerals, and a detailed description thereof will be omitted.

In this tunable laser device, a first photodetector and a second photodetector are integrated into the optical waveguide device structure 10 instead of the configuration in which the first photodetector and the second photodetector are arranged outside the optical waveguide device structure 10. That is, in the tunable laser device, a first photodetector and a second photodetector are integrated on the semiconductor substrate 15 which is a silicon substrate, and are formed as the optical waveguide device structure 10. In the present embodiment, the first photodetector and the second photodetector are, for example, germanium-photodiodes (Ge-PDs) 22 and 23.

According to the present embodiment, by integrating the first photodetector and the second photodetector in the optical waveguide device structure 10, further size miniaturization of the tunable laser device including the wavelength locker is realized.

Fourth Embodiment

Figure 7:
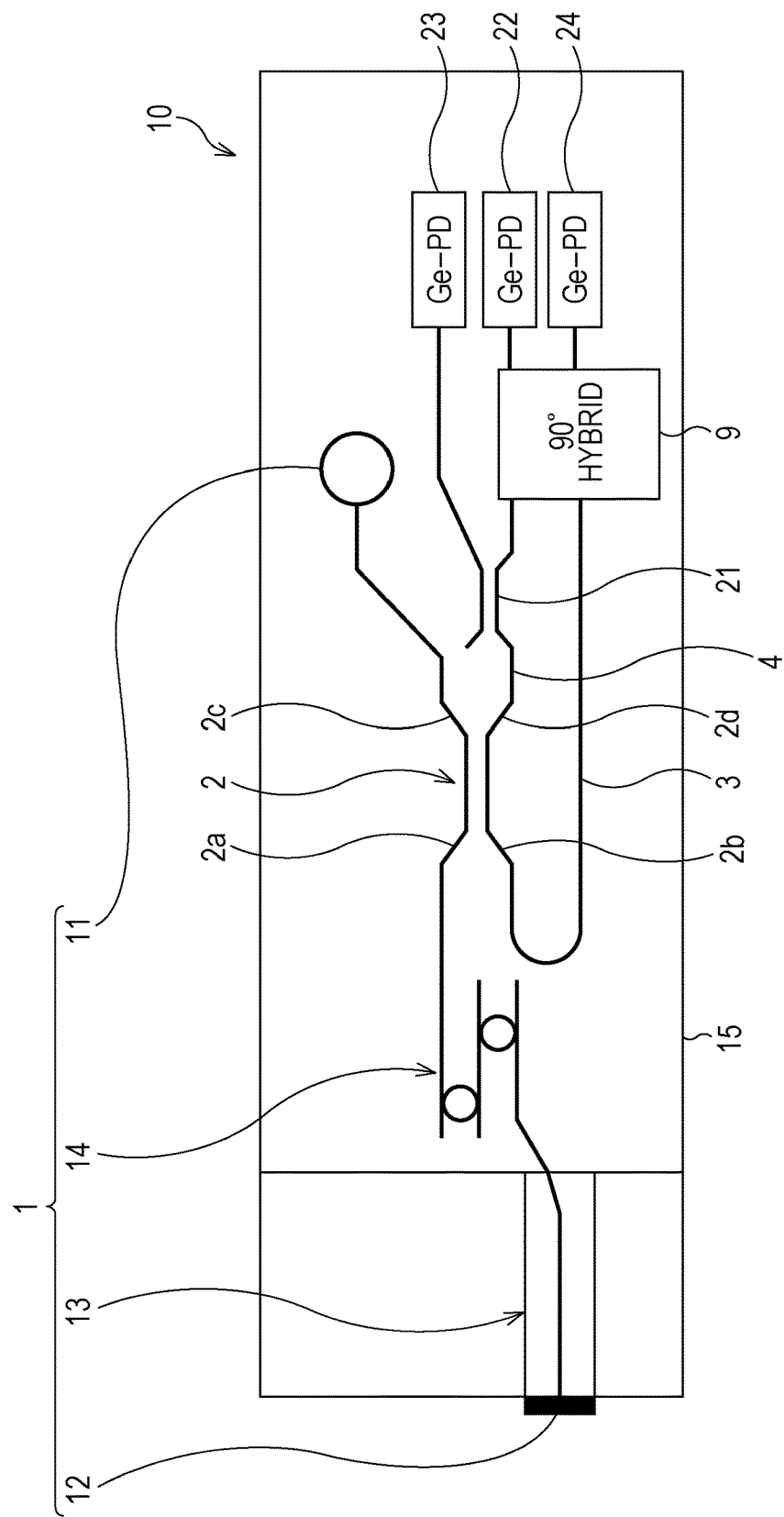
FIG. 7 is a schematic diagram illustrating a configuration example of a tunable laser device according to a fourth embodiment.

A fourth embodiment will be described below. In the present embodiment, a tunable laser device is disclosed similarly to the third embodiment, but differs from the third embodiment in that the configuration of the wavelength locker is different. FIG. 7 is a schematic diagram illustrating a configuration example of the tunable laser device according to the fourth embodiment. In FIG. 7, the same components as those illustrated in FIG. 6 of the third embodiment are denoted by the same reference numerals, and a detailed description thereof will be omitted.

In this tunable laser device, a 90° hybrid 9 is provided instead of the optical coupler 5 which is a 2×1 MMI optical coupler. The 90° hybrid 9 includes two input ports and at least two output ports. One input port is coupled to the first optical waveguide 3 and the other input port is coupled to the second optical waveguide 4. The 90° hybrid 9 includes a filter characteristic such that the phase difference between the output light at one output port and the output light at the other output port is π/2 (90°).

In the present embodiment, a first photodetector is coupled to one output port of the 90° hybrid 9, and a third photodetector is coupled to the other output port. In the tunable laser device, the first photodetector, a second photodetector, and the third photodetector are integrated on the semiconductor substrate 15 which is a silicon substrate and are formed as the optical waveguide device structure 10. In the present embodiment, the first photodetector, the second photodetector, and the third photodetector are, for example, Ge-PDs 22, 23, and 24.

According to the present embodiment, by integrating the first photodetector, the second photodetector, and the third photodetector in the optical waveguide device structure 10, further size miniaturization of the tunable laser device including the wavelength locker is realized. In addition, by using the 90° hybrid 9 as an optical coupler and monitoring the output light intensities of the two output ports whose phase difference is 90° as described above, stable wavelength control is realized for any wavelength.

Fifth Embodiment

Figure 8:
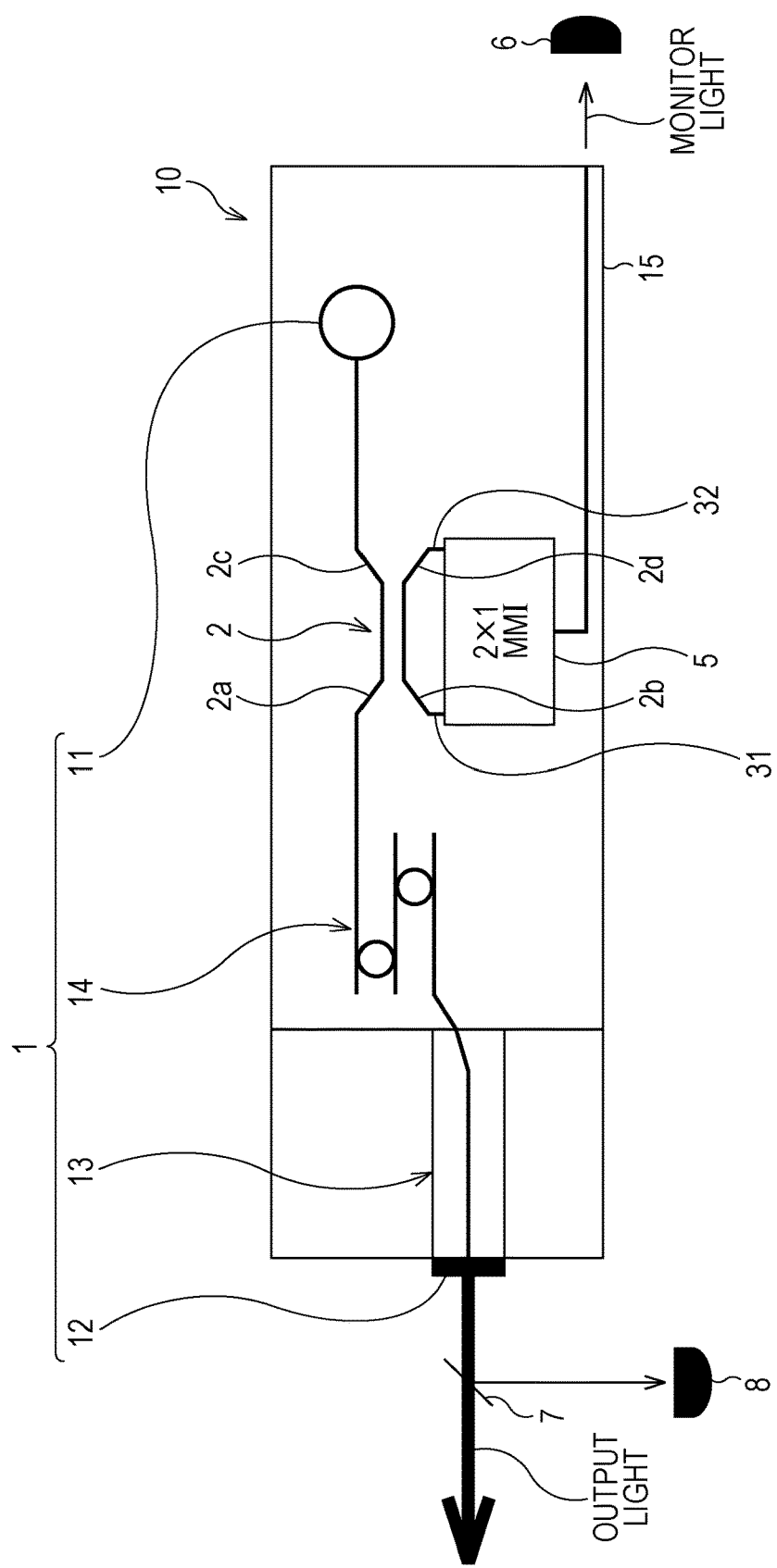
FIG. 8 is a schematic diagram illustrating a configuration example of a tunable laser device according to a fifth embodiment.

A fifth embodiment will be described below. In the present embodiment, a tunable laser device is disclosed similarly to the first embodiment, but differs from the first embodiment in that the configuration of the wavelength locker is different. FIG. 8 is a schematic diagram illustrating a configuration example of the tunable laser device according to the fifth embodiment. In FIG. 8, the same components as those illustrated in FIG. 3 of the first embodiment are denoted by the same reference numerals, and a detailed description thereof will be omitted.

In this tunable laser device, the first optical coupler 5 is arranged immediately below the first optical splitter 2 in FIG. 8. A first optical waveguide 31 that couples the second port 2b of the first optical splitter 2 and the first optical coupler 5, and a second optical waveguide 32 that couples the fourth port 2d of the first optical splitter 2 and the first optical coupler 5 are arranged. The first optical waveguide 31 and the second optical waveguide 32 have substantially the same highly short length and are symmetrically arranged with respect to the first optical splitter 2.

In the present embodiment, the arrangement positions of the first optical splitter 2 and the first mirror 11 are adjusted such that the distance $L_C$ between the first optical splitter 2 and the first mirror 11 is substantially equal to the delay amount $\Delta L$ of the light propagating through the first optical waveguide 3 with respect to the light propagating through the second optical waveguide 4. That is, in this case, the delay portion of the delay interference waveguide is almost entirely arranged in the laser resonator.

In the above arrangement, the delay portion of the delay interference waveguide outside the laser resonator becomes optional and both the lengths of the first optical waveguide 31 and the second optical waveguide 32 may be shortened to the limit. As a result, it is possible to miniaturize the size of the wavelength locker as much as possible, and further to miniaturize the overall size of the tunable laser device including the wavelength locker as much as possible.

Sixth Embodiment

Figure 9:
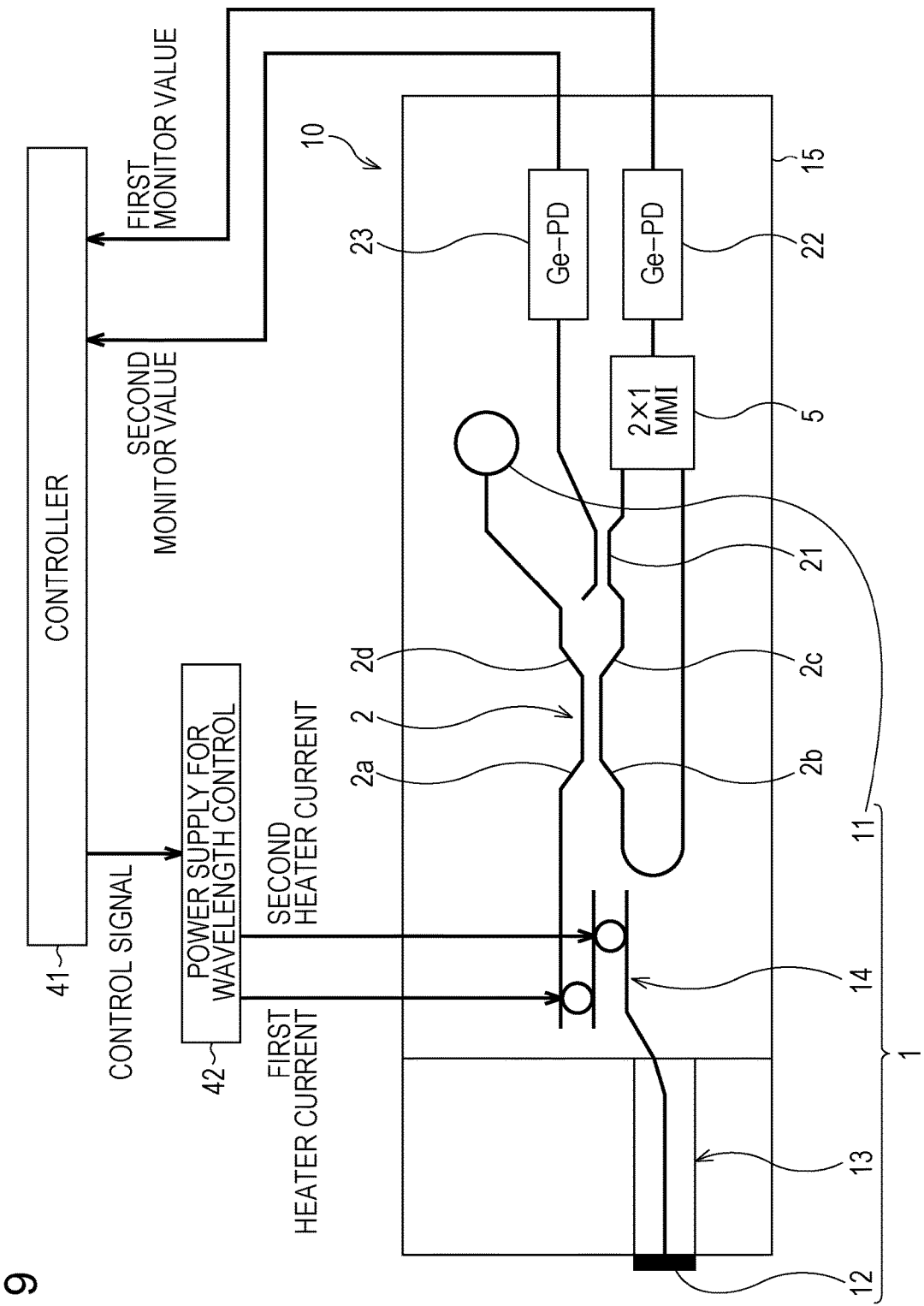
FIG. 9 is a schematic diagram illustrating a schematic configuration of a tunable laser unit according to a sixth embodiment.

A sixth embodiment will be described below. In the present embodiment, a tunable laser unit including one tunable laser device selected from the first to fifth embodiments (including the modification example) is disclosed. In the following example, a tunable laser unit including a tunable laser device according to the third embodiment illustrated in FIG. 6 will be described. FIG. 9 is a schematic diagram illustrating a schematic configuration of the tunable laser unit according to the sixth embodiment. In FIG. 9, the same components as those illustrated in FIG. 6 of the third embodiment are denoted by the same reference numerals, and a detailed description thereof will be omitted.

The tunable laser unit includes the optical waveguide device structure 10 which is a tunable laser device according to the third embodiment, a controller 41, and a power supply for wavelength control 42. The controller 41 is electrically coupled to the Ge-PDs 22 and 23 of the optical waveguide device structure 10, respectively, receives the respective signals of a first monitor value of the Ge-PD 22 and a second monitor value of the Ge-PD 23, and sends a control signal to the power supply for wavelength control 42 based on these signals. The power supply for wavelength control 42 causes a first heater current and a second heater current to flow to the respective heater electrodes of the two ring resonators of the tunable filter 14 according to the control signal received from the controller 41.

In the tunable laser unit, based on the monitor value of the optical waveguide device structure 10, that is, the value corresponding to the transmittance of the filter for the wavelength locker, feedback control is performed on the heater current of each ring resonator so that the monitor value coincides with the transmittance of a target wavelength. In this manner, it is possible to perform laser oscillation at a desired wavelength.

According to the present embodiment, a highly reliable tunable laser unit including a small tunable laser device and capable of performing laser oscillation of a desired wavelength is realized.

Seventh Embodiment

Figure 10:
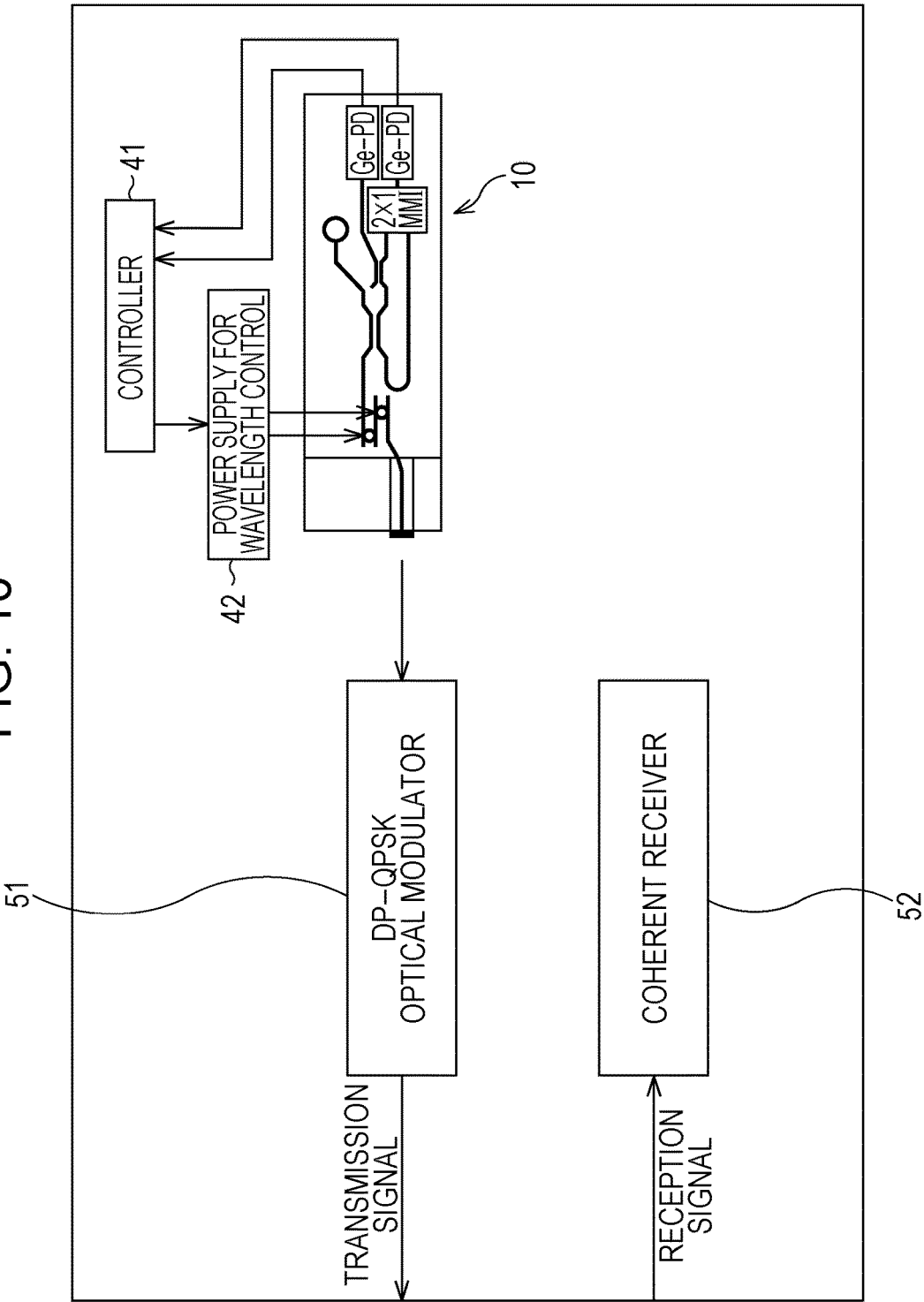
FIG. 10 is a schematic diagram illustrating a schematic configuration of an optical transceiver according to a seventh embodiment.

A seventh embodiment will be described below. In the present embodiment, FIG. 10 disclosing an optical transceiver including a tunable laser unit according to a sixth embodiment is a schematic diagram illustrating a schematic configuration of an optical transceiver according to a seventh embodiment. In FIG. 10, the same components as those illustrated in FIG. 9 of the sixth embodiment are denoted by the same reference numerals, and a detailed description thereof will be omitted.

This optical transceiver includes the optical waveguide device structure 10 which is a tunable laser device according to the third embodiment, a DP-QPSK optical modulator 51, and a coherent receiver 52. The DP-QPSK optical modulator 51 is an optional modulator of a polarization multiplexing quadrature phase modulation (DP-QPSK) system for modulating the laser light output from the optical waveguide device structure 10 to generate and transmit a transmission signal which is an optical signal. The coherent receiver 52 is for receiving a reception signal which is an optical signal.

According to the present embodiment, a highly reliable optical transceiver including a small tunable laser device and capable of optical transmission and reception at an arbitrary wavelength is realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A tunable laser device comprising:
a tunable laser configured to include a tunable filter and a mirror;
a first optical splitter provided between the tunable filter and the mirror, the first optical splitter including a first port and a second port on a tunable filter side and a third port and a fourth port on a mirror side, in which the tunable filter is coupled to the first port and the mirror is coupled to the third port, respectively;
a first optical waveguide coupled to the second port;
a second optical waveguide coupled to the fourth port; and
an optical coupler with which the first optical waveguide and the second optical waveguide are combined.

2. The tunable laser device according to claim 1, wherein, when a first length of the first optical waveguide is $L_1$, a second length of the second optical waveguide is $L_2$, and a distance between the first optical splitter and the mirror is $L_c$,
$L_1$, $L_2$, and $L_c$ are set so that a value of $(L_1+2L_c)-L_2$ becomes a delay amount corresponding to light transmission characteristics of a desired cycle.

3. The tunable laser device according to claim 1, wherein the first optical waveguide and the second optical waveguide are set to have a same length.

4. The tunable laser device according to claim 3, wherein the first optical waveguide and the second optical waveguide are symmetrically arranged with respect to the first optical splitter.

5. The tunable laser device according to claim 1, further comprising:

a first photodetector configured to detect an output light intensity of the optical coupler; and
a second photodetector configured to detect an output light intensity of the tunable laser.

6. The tunable laser device according to claim 1, further comprising:
a first photodetector configured to detect an output light intensity of the optical coupler; and
a second splitter including a first port on the tunable filter side, a second port and a third port on the mirror side, the first port being coupled to the tunable filter and the second port being coupled to
a second photodetector configured to detect an intensity of light branched by the second optical splitter.

7. The tunable laser device according to claim 6, wherein the second optical splitter is coupled between the tunable filter and the first optical splitter.

8. The tunable laser device according to claim 6, wherein the second optical splitter is arranged in the second optical waveguide.

9. The tunable laser device according to claim 1, wherein the tunable filter, the mirror, the first optical splitter, and the optical coupler are formed on a same substrate as an optical waveguide together with the first optical waveguide and the second optical waveguide.

10. The tunable laser device according to claim 6, wherein the tunable filter, the mirror, the first optical splitter, the second optical splitter, and the optical coupler are formed on a substrate as an optical waveguide together with the first optical waveguide and the second optical waveguide.

11. The tunable laser device according to claim 6, wherein the tunable filter, the mirror, the first optical splitter, the second optical splitter, and the first optical coupler are formed on a substrate as an optical waveguide together with the first optical waveguide and the second optical waveguide, and
the first photodetector and the second photodetector are integrated on the substrate.

12. The tunable laser device according to claim 1, wherein the optical coupler includes a pair of output ports at which a phase difference of output light is $\pi/2$.

* * * * *